(12) United States Patent
Park et al.

(10) Patent No.: US 11,881,279 B2
(45) Date of Patent: *Jan. 23, 2024

(54) SOLID STATE DRIVE DEVICE AND METHOD FOR FABRICATING SOLID STATE DRIVE DEVICE

(71) Applicant: SAMSUNG ELECTRONICS CO., LTD., Suwon-si (KR)

(72) Inventors: Ji Woon Park, Suwon-si (KR); Jae-Sang Yun, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/879,479

(22) Filed: Aug. 2, 2022

(65) Prior Publication Data

US 2022/0366940 A1 Nov. 17, 2022

Related U.S. Application Data

(63) Continuation of application No. 16/885,832, filed on May 28, 2020, now Pat. No. 11,423,950.

(30) Foreign Application Priority Data

Sep. 23, 2019 (KR) .................. 10-2019-0116505

(51) Int. Cl.
*G11C 5/06* (2006.01)
*H01L 23/00* (2006.01)
*G11C 5/02* (2006.01)

(52) U.S. Cl.
CPC ............ *G11C 5/06* (2013.01); *G11C 5/025* (2013.01); *H01L 24/45* (2013.01)

(58) Field of Classification Search
CPC .. G11C 5/06; G11C 5/025; G11C 7/10; G11C 2207/10; G11C 5/063; G11C 5/04;
(Continued)

(56) References Cited

U.S. PATENT DOCUMENTS 5,909,703 A * 6/1999 Hansen ............... G06F 12/0623
711/167
8,664,780 B2 3/2014 Han et al.
(Continued)

FOREIGN PATENT DOCUMENTS

CN 113836523 A * 12/2021 ......... G06F 12/1491
EP 3104277 A1 * 12/2016 ......... G01R 31/2896
(Continued)

OTHER PUBLICATIONS

Valad Beigi, Majed, Thermal-Aware Optimizations for Emerging Technologies in 3D-Stacked Chips, 2019, Northwestern University. All pages. (Year: 2019).*

*Primary Examiner* — Michael T Tran
(74) *Attorney, Agent, or Firm* — Sughrue Mion, PLLC

(57) ABSTRACT

A solid state drive (SSD) device, including a substrate; a first buffer chip disposed on the substrate; a second buffer chip disposed on the first buffer chip; a plurality of first nonvolatile memory chips connected to the second buffer chip through wire bonding; a controller configured to transmit a control signal to the plurality of first nonvolatile memory chips through a first channel; and a first redistribution layer disposed in the substrate and configured to electrically connect the first channel to the first buffer chip, wherein the first buffer chip is connected to the first redistribution layer through flip chip bonding, and the second buffer chip is connected to the first redistribution layer through a first wire.

20 Claims, 22 Drawing Sheets

(58) Field of Classification Search
CPC ....... G11C 7/1006; H01L 24/45; H01L 24/02; H01L 24/13; H01L 25/0652; H01L 2224/02331; H01L 2224/02373; H01L 2224/02381; H01L 2224/13008
USPC .................................... 711/103; 365/189.05
See application file for complete search history.

(56) References Cited

U.S. PATENT DOCUMENTS

| | | | |
|---|---|---|---|
| 8,674,494 B2 | 3/2014 | Nam et al. | |
| 8,947,931 B1* | 2/2015 | D'Abreu | H01L 25/0652 365/185.11 |
| 9,263,105 B2 | 2/2016 | Jeon et al. | |
| 9,496,216 B2 | 11/2016 | Chun et al. | |
| 9,899,347 B1 | 2/2018 | Mostovoy et al. | |
| 10,176,886 B1* | 1/2019 | Spencer | G06F 11/1012 |
| 10,489,318 B1* | 11/2019 | Bruce | G06F 3/0656 |
| 11,423,950 B2* | 8/2022 | Park | H01L 25/18 |
| 2006/0267173 A1 | 11/2006 | Takiar et al. | |
| 2009/0096111 A1 | 4/2009 | Fujiwara et al. | |
| 2009/0200652 A1* | 8/2009 | Oh | H01L 25/0657 438/109 |
| 2011/0215836 A1* | 9/2011 | Shimizu | G11C 7/1057 326/83 |
| 2011/0292742 A1* | 12/2011 | Oh | G11C 29/702 257/774 |
| 2012/0059984 A1* | 3/2012 | Kang | G11C 5/02 257/774 |
| 2013/0119542 A1 | 5/2013 | Oh | |
| 2013/0148402 A1* | 6/2013 | Chang | G11C 8/08 365/63 |
| 2013/0161788 A1 | 6/2013 | Chun et al. | |
| 2014/0252640 A1* | 9/2014 | Kwak | H01L 25/0652 257/773 |
| 2014/0347951 A1* | 11/2014 | Kim | G11C 29/021 365/230.06 |
| 2015/0378885 A1* | 12/2015 | Kim | G06F 12/0246 711/103 |
| 2016/0034371 A1* | 2/2016 | Oh | G11C 8/00 714/6.2 |
| 2016/0181214 A1* | 6/2016 | Oh | H10N 69/00 257/777 |
| 2016/0350181 A1* | 12/2016 | Cha | G06F 11/1068 |
| 2017/0154655 A1* | 6/2017 | Seo | G11C 7/10 |
| 2017/0220293 A1* | 8/2017 | Kim | G11C 5/02 |
| 2017/0277606 A1* | 9/2017 | Lee | G06F 11/2017 |
| 2017/0358564 A1* | 12/2017 | Lee | H01L 25/18 |
| 2018/0005670 A1* | 1/2018 | Lee | G11C 7/1072 |
| 2018/0011633 A1 | 1/2018 | Park | |
| 2018/0012867 A1* | 1/2018 | Kim | H01L 25/18 |
| 2018/0032252 A1* | 2/2018 | Yu | G06F 3/0656 |
| 2018/0102344 A1* | 4/2018 | Ramachandra | G11C 7/22 |
| 2018/0102776 A1* | 4/2018 | Chandrasekar | G06F 1/3287 |
| 2018/0122434 A1* | 5/2018 | Lee | G11C 5/04 |
| 2018/0158799 A1* | 6/2018 | Na | H01L 25/0652 |
| 2018/0350414 A1* | 12/2018 | Park | G11C 16/32 |
| 2019/0012093 A1* | 1/2019 | Spencer | G06F 3/0619 |
| 2019/0012264 A1* | 1/2019 | Jeong | G06F 3/0658 |
| 2019/0033952 A1* | 1/2019 | Mcilvain | G06F 1/3203 |
| 2019/0074265 A1* | 3/2019 | Kushida | H01L 24/73 |
| 2019/0079886 A1* | 3/2019 | Malladi | G06F 9/4806 |
| 2019/0080774 A1* | 3/2019 | Lee | G11C 7/1093 |
| 2019/0088339 A1* | 3/2019 | Miyashita | G11C 11/54 |
| 2019/0095134 A1* | 3/2019 | Li | G06F 3/061 |
| 2019/0107947 A1* | 4/2019 | Kojima | G06F 3/0656 |
| 2019/0131203 A1* | 5/2019 | Kang | H01L 23/4334 |
| 2019/0187918 A1* | 6/2019 | Lee | G06F 3/0613 |
| 2019/0189592 A1 | 6/2019 | Son et al. | |
| 2019/0251043 A1* | 8/2019 | Park | G06F 11/3037 |
| 2019/0259737 A1 | 8/2019 | Song et al. | |
| 2019/0311774 A1* | 10/2019 | Lee | G11C 29/38 |
| 2019/0362804 A1* | 11/2019 | Kim | G11C 29/50008 |
| 2020/0035648 A1 | 1/2020 | Kuo et al. | |
| 2021/0242171 A1* | 8/2021 | Lee | G11C 5/04 |
| 2021/0382648 A1* | 12/2021 | Kanno | G06F 3/0679 |
| 2022/0101894 A1* | 3/2022 | Lee | G11C 7/1093 |

FOREIGN PATENT DOCUMENTS

| | | | | |
|---|---|---|---|---|
| JP | 5105417 B2 | 12/2012 | | |
| WO | WO-2016191304 A1 * | 12/2016 | | H04L 45/14 |
| WO | WO-2018063138 A1 * | 4/2018 | | G06N 10/00 |

* cited by examiner

SOLID STATE DRIVE DEVICE AND METHOD FOR FABRICATING SOLID STATE DRIVE DEVICE

CROSS-REFERENCE TO RELATED APPLICATION

This is a Continuation of U.S. application Ser. No. 16/885,832 filed May 28, 2020, now issued as U.S. Pat. No. 11,423,950, which is based on and claims priority under 35 U.S.C. § 119 to Korean Patent Application No. 10-2019-0116505, filed on Sep. 23, 2019, the disclosure of which is incorporated by reference herein in its entirety.

This is a Continuation of U.S. application Ser. No. 16/885,832 filed May 28, 2020, which is based on and claims priority under 35 U.S.C. § 119 to Korean Patent Application No. 10-2019-0116505, filed on Sep. 23, 2019, the disclosure of which is incorporated by reference herein in its entirety.

BACKGROUND

1. Field

The present disclosure relates to a solid state drive (SSD) device and a method for fabricating the same.

2. Description of Related Art

Magnetic disks have traditionally been used as data storage devices for electronic systems such as computer systems. However, with the development of semiconductor technology, a solid state drive (SSD) device that uses a nonvolatile memory such as a flash memory, for example a NAND-type flash memory, as a data storage device instead of a magnetic disk has been increasingly used in computer systems and portable devices.

Because the solid state drive device does not include a mechanical drive unit such as a motor that is essentially used for a hard disk drive (HDD) device, there may be very little heat and noise at the time of operation. Also, the solid state drive device may be desirable as a data storage device because of a fast access rate, a high integration, and stability against external shocks. In addition, the data transmission rate of the solid state drive device may be much faster than the data transmission rate of the hard disk drive.

In general, a solid state drive device may have a plurality of nonvolatile memory chips connected to each of a plurality of channels. However, as the storage capacity of the solid state drive device increases, the number of the plurality of nonvolatile memory chips connected to each of the plurality of channels may increase. However, there is a problem in which, when the number of the plurality of nonvolatile memory chips connected to each of the plurality of channels increases, the load to be driven for each channel increases, and the operating speed of the solid state drive device decreases.

SUMMARY

According to embodiments, a solid state drive (SSD) device includes a substrate; a first buffer chip disposed on the substrate; a second buffer chip disposed on the first buffer chip; a plurality of first nonvolatile memory chips connected to the second buffer chip through wire bonding; a controller configured to transmit a control signal to the plurality of first nonvolatile memory chips through a first channel; and a first redistribution layer disposed in the substrate and configured to electrically connect the first channel to the first buffer chip, wherein the first buffer chip is connected to the first redistribution layer through flip chip bonding, and the second buffer chip is connected to the first redistribution layer through a first wire.

According to embodiments, a solid state drive device includes a first buffer chip; a supporting film disposed on the first buffer chip; a second buffer chip disposed on the supporting film; a plurality of first nonvolatile memory chips connected to the second buffer chip through a wire bonding; a first redistribution layer connected to the first buffer chip and the second buffer chip through the wire bonding; and a controller configured to transmit a control signal to the plurality of first nonvolatile memory chips through a first channel electrically connected to the first redistribution layer.

According to embodiments, a solid state drive device includes a substrate; a first buffer chip on one side of the substrate; a second buffer chip disposed on the first buffer chip; a first redistribution layer, a second redistribution layer, and a third redistribution layer which are formed in the substrate and connected to the first buffer chip in through a flip chip bonding, wherein the first redistribution layer is electrically connected to the first buffer chip through a first connection terminal, the second redistribution layer is electrically connected to the first buffer chip through a second connection terminal, and the third redistribution layer is electrically connected to the first buffer chip through a third connection terminal; a plurality of first nonvolatile memory chips including a first nonvolatile memory chip bottom region connected to the second buffer chip by a first wire, and a first nonvolatile memory chip top region connected to the second buffer chip by a second wire and disposed on the first nonvolatile memory chip bottom region; a controller connected to the first redistribution layer and configured to transmit a control signal to the first buffer chip through a first channel; a plurality of external connection terminals connected to the first channel and disposed on a back side of the substrate facing one side of the substrate; and a plurality of second nonvolatile memory chips including a second nonvolatile memory chip bottom region connected to the third redistribution layer by a third wire, and a second nonvolatile memory chip top region connected to the second redistribution layer by a fourth wire and disposed on the second nonvolatile memory chip bottom region, wherein the second buffer chip is electrically connected to the first redistribution layer through a fifth wire.

According to embodiments, a method for fabricating a solid state drive device includes forming a first redistribution layer in a substrate, forming a first connection pad connected to the first redistribution layer on an upper side of the substrate; forming a first connection terminal on the first connection pad; forming a plurality of external connection terminals on a lower side facing the upper side of the substrate; sequentially stacking a first buffer chip and a second buffer chip on the first connection terminal; sequentially stacking a plurality of first nonvolatile memory chips on the upper side of the substrate in a first direction; connecting the second buffer chip and the first connection pad through a first wire; and connecting the plurality of first nonvolatile memory chips to the second buffer chip through a wire bonding.

BRIEF DESCRIPTION OF THE DRAWINGS

Embodiments will be more clearly understood from the following detailed description taken in conjunction with the accompanying drawings, in which.

DETAILED DESCRIPTION OF THE EMBODIMENTS

Embodiments may provide a solid state drive device that has a high capacity and can also improve the operating speed. Embodiments may also provide a method for fabricating a solid state drive device that has a high capacity and can also improve the operating speed. However, embodiments are not restricted to the ones set forth herein. The above and other aspects of the embodiments will become more apparent to one of ordinary skill in the art to which the present disclosure pertains by referencing the detailed description of the present inventive concept given below. The embodiments described herebelow are all exemplary, and thus, the inventive concept is not limited to the embodiments disclosed below and may be realized in various other forms. It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. Like numerals refer to like elements throughout.

Figure 1:
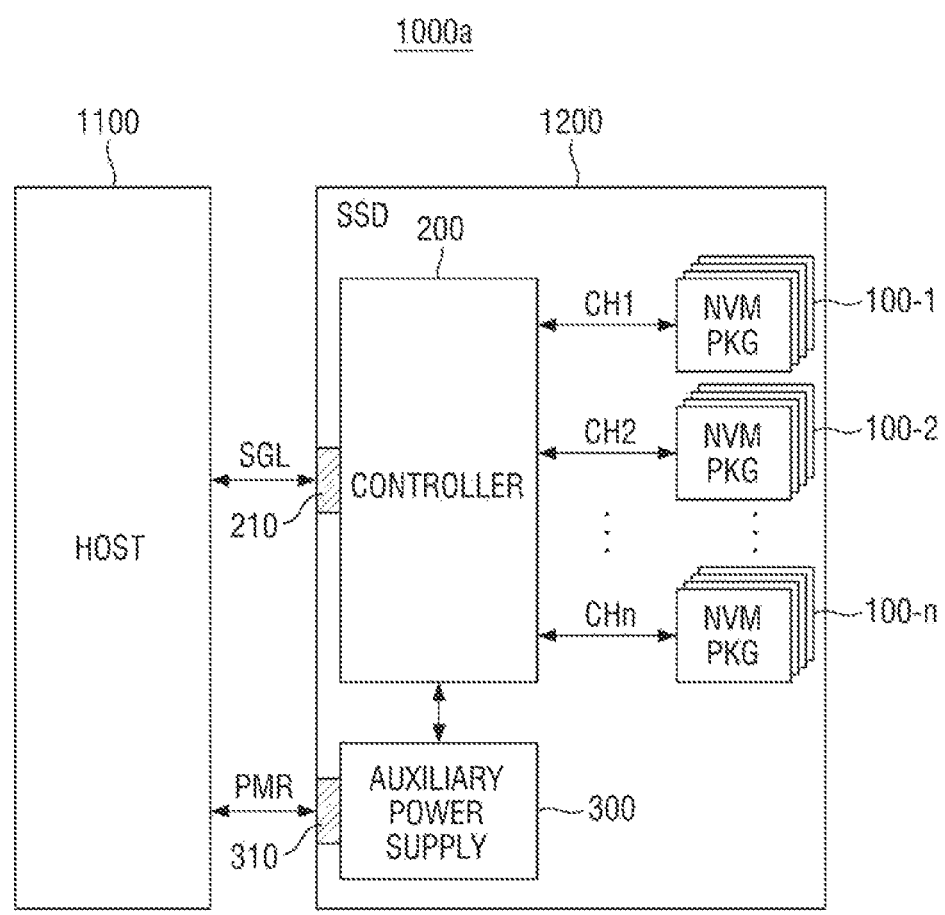
FIG. 1 is a block diagram showing an example of a solid state drive system according to embodiments.

FIG. 1 is a block diagram showing an example of a solid state drive system according to embodiments.

Referring to FIG. 1, a solid state drive system 1000*a* may include a host 1100 and a solid state drive device 1200.

The solid state drive device 1200 may include a plurality of nonvolatile memory (NVM) packages 100-1 to 100-*n* including a first nonvolatile memory package 100-1 to an nth nonvolatile memory package 100-*n*. The plurality of nonvolatile memory packages may be used as a storage medium of the solid state drive device 1200.

Each of the plurality of nonvolatile memory packages 100-1 to 100-*n* according to embodiments may include a plurality of nonvolatile memory chips. Each of the plurality of nonvolatile memory chips may include a flash memory device.

The controller 200 may be connected to each of the plurality of nonvolatile memory packages 100-1 to 100-*n* through a plurality of channels CH1 to CHn. Each of the plurality of nonvolatile memory packages 100-1 to 100-*n* according to embodiments may be connected to the controller 200 through a single channel.

The controller 200 may transmit and receive a control signal SGL to and from the host 1100 through a signal connector 210. The control signal SGL may include a command, an address, and/or data. The controller 200 may write data on the plurality of nonvolatile memory packages 100-1 to 100-*n* or may read data from the plurality of nonvolatile memory packages 100-1 to 100-*n*, depending on the command of the host 1100.

The solid state drive device 1200 may further include an auxiliary power supply 300. The auxiliary power supply 300 may receive input of power PWR from the host 1100 through a power connector 310 and supply the power to the controller 200. The position of the auxiliary power supply 300 is not limited thereto, and in embodiments the auxiliary power supply 300 may also be located outside the solid state drive device 1200.

Figure 2:
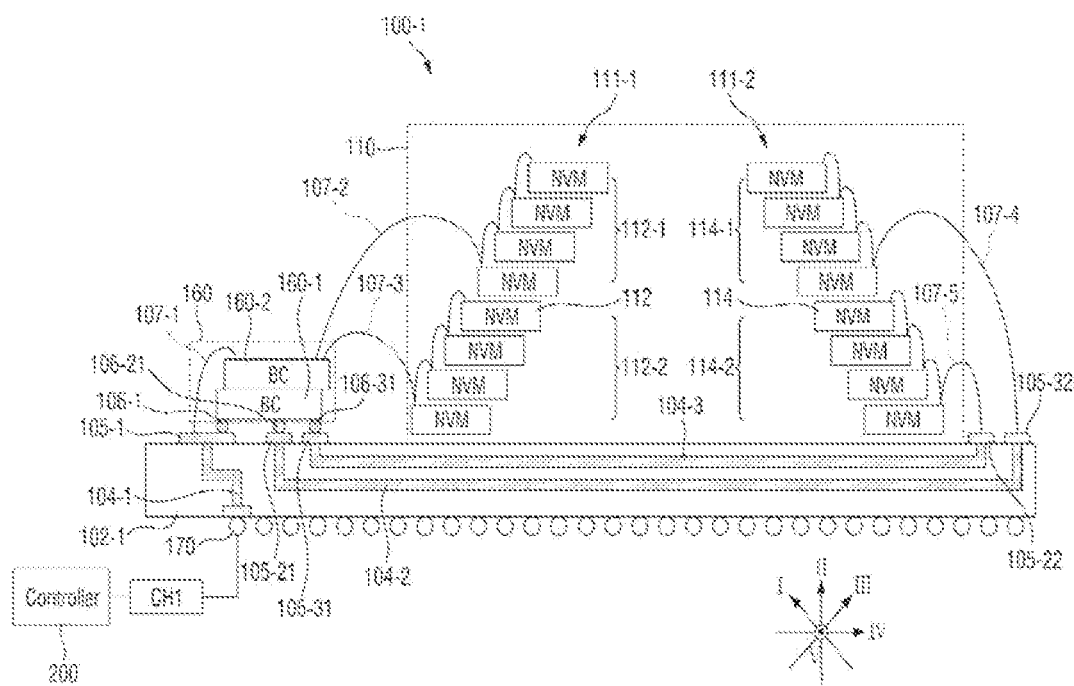
FIG. 2 is a diagram showing an example of a solid state drive device according to embodiments.
Figure 3:
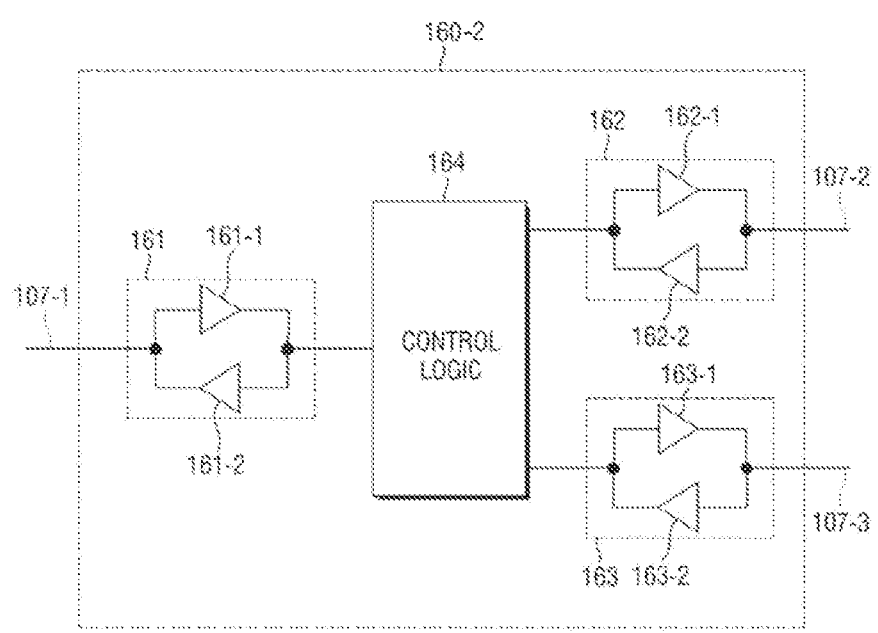
FIG. 3 is a circuit diagram of an example of a buffer chip of FIG. 2 according to embodiments.
Figure 4:
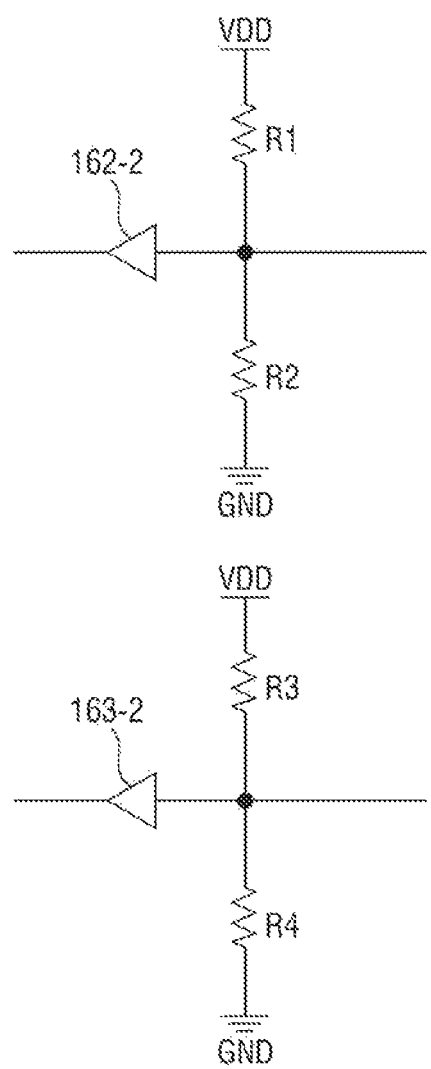
FIG. 4 is a circuit diagram showing a second receiver and a third receiver of FIG. 3 according to embodiments.

FIG. 2 is a diagram showing an example of a solid state drive device according to embodiments. FIG. 3 is a circuit diagram of an example of a buffer chip of FIG. 2 according to embodiments. FIG. 4 is a circuit diagram showing an example of a second receiver and a third receiver of FIG. 3 according to embodiments. For reference, the first nonvolatile memory package 100-1 connected to the controller 200 through the first channel CH1 will be described as an example for convenience of explanation.

Referring to FIG. 2, the solid state drive device may include a controller 200, buffer chips (BC), for example a first buffer chip 160-1 and a second buffer chip 160-2 in a buffer region 160, which may transmit and receive data to and from the controller 200 through the first channel CH1, and a nonvolatile memory region 110 that transmits and receives data to and from the controller 200 through the buffer chips, for example the first buffer chip 160-1 and the second buffer chip 160-2.

The first channel CH1 and the buffer chips, for example the first buffer chip 160-1 and the second buffer chip 160-2, may be electrically connected to each other through a first redistribution layer 104-1 formed in the substrate 102-1. In embodiments, first redistribution layer 104-1 may be, for example, a wiring layer. In detail, a plurality of external connection terminals 170 may be disposed below the substrate 102-1. That is, the plurality of external connection terminals 170 may be electrically connected to the first channel CH1 in order to electrically connect the first redistribution layer 104-1 and the first channel CH1 to each other.

In the following drawings, although the plurality of external connection terminals 170 is shown as solder balls, the present invention is not limited thereto. For example, the plurality of external connection terminals 170 may be solder bumps, grid arrays, conductive tabs or the like. Further, the number of the plurality of external connection terminals 170 is not limited to the number shown in the drawing.

A first connection pad 105-1 may be formed on an upper part of the substrate 102-1 facing a lower part of the substrate 102-1, and may be electrically connected to the first connection terminal 106-1 of the first buffer chip 160-1 connected, for example in the form of a flip chip. The first connection pad 105-1 may also be connected to the first wire 107-1 in order to electrically connect the second buffer chip 160-2 and the first redistribution layer 104-1 to each other.

A second redistribution layer 104-2 may be further disposed inside the substrate 102-1. The second redistribution layer 104-2 may extend in a fourth direction IV and may pass through the lower part of the nonvolatile memory region 110. The second redistribution layer 104-2 may be connected to a second connection pad 105-21 located in a—fourth direction IV of the nonvolatile memory region 110. The first buffer chip 160-1 may be connected to the second connection pad 105-21, for example in the form of a flip chip, through a second connection terminal 106-21 connected to the first buffer chip 160-1. The second redistribution layer 104-2 may be electrically connected to a fifth connection pad 105-32 disposed in the fourth direction IV of the nonvolatile memory region 110. The fifth connection pad 105-32 may be electrically connected to a second nonvolatile memory chip top region 114-1 to be described later through a fourth wire 107-4. That is, the controller 200 and the second nonvolatile memory chip top region 114-1 may transmit and receive data through the second redistribution layer 104-2.

A third redistribution layer 104-3 may further be disposed inside the substrate 102-1. The third redistribution layer 104-3 may extend in the fourth direction IV and may pass through the lower part of the nonvolatile memory region 110. The third redistribution layer 104-3 may be connected to the third connection pad 105-31 located in the—fourth direction IV of the nonvolatile memory region 110. The first buffer chip 160-1 may be connected to the third connection pad 105-31, for example in the form of a flip chip, through a third connection terminal 106-31 connected to the first buffer chip 160-1. The third redistribution layer 104-3 may also be further electrically connected to a fourth connection pad 105-22 located in the fourth direction IV of the nonvolatile memory region 110. The fourth connection pad 105-22 may be electrically connected to a second nonvolatile memory chip bottom region 114-2 to be described later through a fifth wire 107-5. That is, the controller 200 and the second nonvolatile memory chip bottom region 114-2 may transmit and receive data through the third redistribution layer 104-3.

The first to third redistribution layers 104-1 to 104-3 and the first to fifth connection pads 105-1, 105-21, 105-31, 105-22, and 105-32 may include a conductive material. For example, the first to third redistribution layers 104-1 to 104-3 and the first to fifth connection pads 105-1, 105-21, 105-31, 105-22, and 105-32 may include gold (Au), silver (Ag), copper (Cu), nickel (Ni) or aluminum (Al). Also, the first connection terminal 106-1, the second connection terminal 106-21 and/or the third connection terminal 106-31 may be, for example, a solder ball, a solder bump or a combination thereof.

A second buffer chip 160-2 may be stacked on the first buffer chip 160-1. The first buffer chip 160-1 and the second buffer chip 160-2 may form a buffer region 160. The second buffer chip 160-2 may be electrically connected to a first nonvolatile memory chip top region 112-1 to be described later through the second wire 107-2. Further, the second buffer chip 160-2 may be electrically connected to a first nonvolatile memory chip bottom region 112-2 to be described later through the third wire 107-3. That is, the first nonvolatile memory chip top region 112-1 and the first nonvolatile memory chip bottom region 112-2 may transmit and receive the data to and from the controller 200 through the second buffer chip 160-2.

Examples of first buffer chip 160-1 and the second buffer chip 160-2 in the buffer region 160 will be described through FIGS. 3 and 4.

Referring to FIGS. 2 and 3, the second buffer chip 160-2 may include a first port 161, a second port 162, a third port 163, and a control logic 164.

The first port 161 may transmit and receive data to and from the controller 200 through a first wire 107-1, a first connection pad 105-1, a first redistribution layer 104-1, an external connection terminal 170, and a first channel CH1. The second port 162 may transmit and receive data to and from the first nonvolatile memory chip top region 112-1 through the second wire 107-2. The third port 163 may transmit and receive data to and from the first nonvolatile memory chip bottom region 112-2 through the third wire 107-3.

The control logic 164 may provide data, which is received from the first port 161, to the first nonvolatile memory chip top region 112-1 through the second port 162 or may provide the data to the first nonvolatile memory chip bottom region 112-2 through the third port 163.

The control logic 164 may provide data, which is received from the first nonvolatile memory chip top region 112-1, to the first port 161 through the second port 162. Also, the control logic 164 may provide data, which is received from the first nonvolatile memory chip bottom region 112-2, to the first port 161 through the third port 163.

The first port 161 according to embodiments may include a first receiver 161-1 that receives data from the controller 200, and a first driver 161-2 that provides data to the controller 200. The second port 162 according to embodiments may include a second receiver 162-2 that receives data from the first nonvolatile memory chip top region 112-1, and a second driver 162-1 that provides data from the control logic 164 to the first nonvolatile memory chip top region 112-1. The third port 163 according to embodiments may include a third receiver 163-2 that receives data from the first nonvolatile memory chip bottom region 112-2, and a third driver 163-1 that provides the data to the first nonvolatile memory chip bottom region 112-2 from the control logic 164. The operating parameters of the first port 161 to the third port 163 according to embodiments may be different from each other.

In the first buffer chip 160-1 according to embodiments, the first port 161 and the first connection terminal 106-1 may be connected to each other to transmit and receive data between the controller 200 and the control logic 164. In addition, in the first buffer chip 160-1 according to embodiments, the second port 162 and the second connection terminal 106-21 may be connected to each other to transmit and receive data between the control logic 164 and the second nonvolatile memory chip top region 114-1. Also, in the first buffer chip 160-1 according to embodiments, a third port 163 and a third connection terminal 106-31 may be connected to each other to transmit and receive data between the control logic 164 and the second nonvolatile memory chip bottom region 114-2. Because the detailed transmission/reception operations are the same as those of the second buffer chip 160-2, a repeated explanation will not be provided.

Referring to FIGS. 3 and 4, the second receiver 162-2 may include on-die termination (ODT) resistors R1 and R2 connected between a power supply voltage VDD and a ground voltage GND. Similarly, the third receiver 163-2 may include on-die termination resistors R3 and R4 connected between the power supply voltage VDD and the ground voltage GND. That is, the dimensions of the on-die termination resistors R1 and R2 of the second receiver 162-2 and the dimensions of the on-die termination resistors R3 and R4 of the third receiver 163-2 may be set independently of each other.

Referring to FIG. 2 again, the nonvolatile memory region 110 according to embodiments may include a first nonvolatile memory region 111-1 and a second nonvolatile memory region 111-2.

The first nonvolatile memory region 111-1 according to embodiments may include a plurality of first nonvolatile memory chips 112. The second nonvolatile memory region 111-2 according to embodiments may include a plurality of second nonvolatile memory chips 114.

The plurality of first nonvolatile memory chips 112 and/or the plurality of second nonvolatile memory chips 114 according to embodiments may include a NAND flash memory, a vertical NAND flash memory (Vertical NAND; VNAND), a NOR flash memory, a resistive random access memory (RRAM), a phase-change memory (PRAM), a magnetoresistive random access memory (MRAM), a ferroelectric random access memory (FRAM), a spin transfer torque random access memory (STT-RAM) or the like. Also, the plurality of first nonvolatile memory chips 112 and/or the plurality of second nonvolatile memory chips 114 according to embodiments may include a three-dimensional array structure.

The first nonvolatile memory region 111-1 according to embodiments may include a first nonvolatile memory chip bottom region 112-2, and a first nonvolatile memory chip top region 112-1 disposed on the first nonvolatile memory chip bottom region 112-2. The number and stacking form of the first nonvolatile memory chips 112 in the first nonvolatile memory region 111-1 are not limited to the arrangement illustrated in this drawing. The first nonvolatile memory chip bottom region 112-2 may include a plurality of first nonvolatile memory chips 112 electrically connected to each other. The first nonvolatile memory chip top region 112-1 may also include a plurality of first nonvolatile memory chips 112 electrically connected to each other.

As described above, the first nonvolatile memory chip top region 112-1 may be electrically connected to the second buffer chip 160-2 through the second wire 107-2, and the first nonvolatile memory chip bottom region 112-2 may be electrically connected to the second buffer chip 160-2 through the third wire 107-3. In embodiments, each of the first nonvolatile memory chip top region 112-1 and the first nonvolatile memory chip bottom region 112-2 may transmit and receive data to and from the controller 200.

The second nonvolatile memory region 111-2 according to embodiments may include a second nonvolatile memory chip bottom region 114-2, and a second nonvolatile memory chip top region 114-1 disposed on the second nonvolatile memory chip bottom region 114-2. The number and stacking form of the second nonvolatile memory chips 114 in the second nonvolatile memory region 111-2 are not limited to the number and stacking form illustrated in this drawing. The second nonvolatile memory chip bottom region 114-2 may include a plurality of second nonvolatile memory chips 114 that are electrically connected to each other. The second nonvolatile memory chip top region 114-1 may also include a plurality of second nonvolatile memory chips 114 electrically connected to each other.

As described above, the second nonvolatile memory chip top region 114-1 may be electrically connected to the first buffer chip 160-1 through the fourth wire 107-4. The second nonvolatile memory chip bottom region 114-2 may be electrically connected to the first buffer chip 160-1 through the fifth wire 107-5. In conclusion, each of the second nonvolatile memory chip top region 114-1 and the second nonvolatile memory chip bottom region 114-2 may transmit and receive data to and from the controller 200.

In order to increase the storage capacity of the solid state drive device, it is possible to increase the number of the plurality of nonvolatile memory chips, for example a plurality of first nonvolatile memory chips 112 or a plurality of second nonvolatile memory chips 114, connected to the same channel, for example the first channel CH1. However, as the number of the nonvolatile memory chips connected to the same channel increases, the parasitic capacitance of the plurality of nonvolatile memory chips formed in the same channel may increase. Therefore, there is a high probability of an occurrence of a phenomenon in which signals transmitted from the controller 200 to the plurality of nonvolatile memory chips are reflected and returned.

However, in the solid state drive device according to embodiments, the regions of the plurality of nonvolatile memory chips connected to the same channel may be divided, for example in to the first nonvolatile memory region 111-1 and the second nonvolatile memory regions 111-2, and formed to be connected to the same channel to be spaced apart from each other. Therefore, it is possible to prevent or reduce a phenomenon in which the signal transmitted from the controller 200 is reflected.

In addition, as for the plurality of stacked buffer chips, for example the first buffer chip 160-1 and the second buffer chip 160-2, some buffer chips, for example the first buffer chip 160-1, may transmit and receive signals to and from the controller 200 in the form of flip chips, and the remaining buffer chip, for example the second buffer chip 160-2, may transmit and receive signals to and from the controller 200 in the form of wire bonding, so that it is possible to reduce parasitic capacitance components that may hinder signal integrity.

Hereinafter, repeated parts of explanation mentioned above will be omitted.

Figure 5:
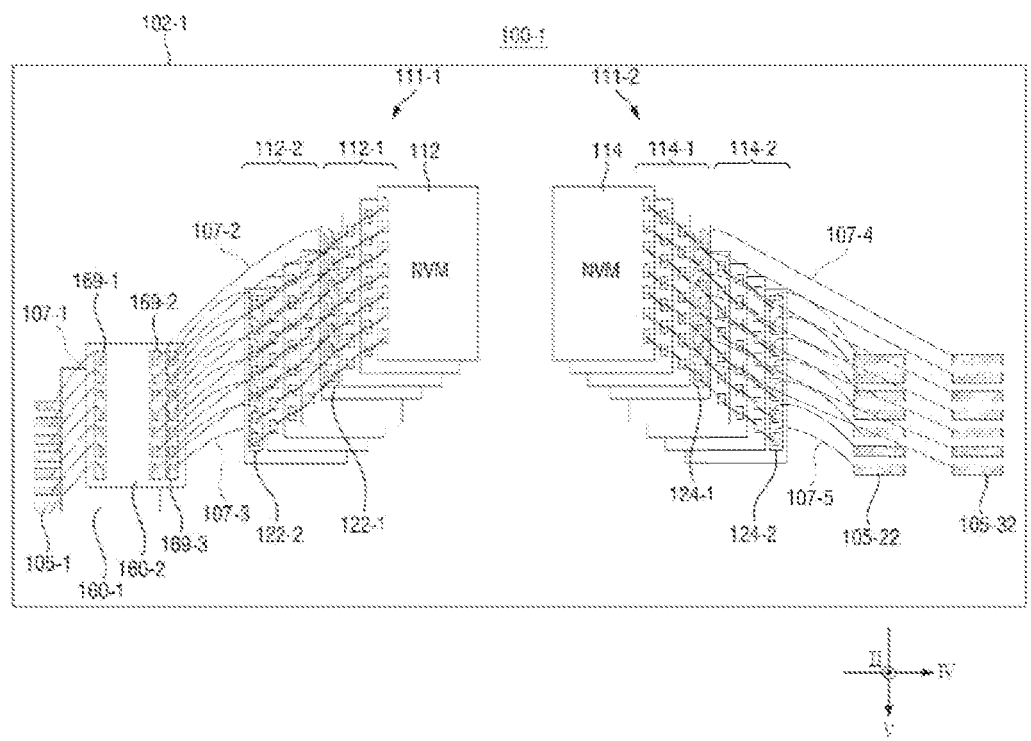
FIG. 5 is a top view of an example of the solid state drive device of FIG. 2 according to embodiments.
Figure 6:
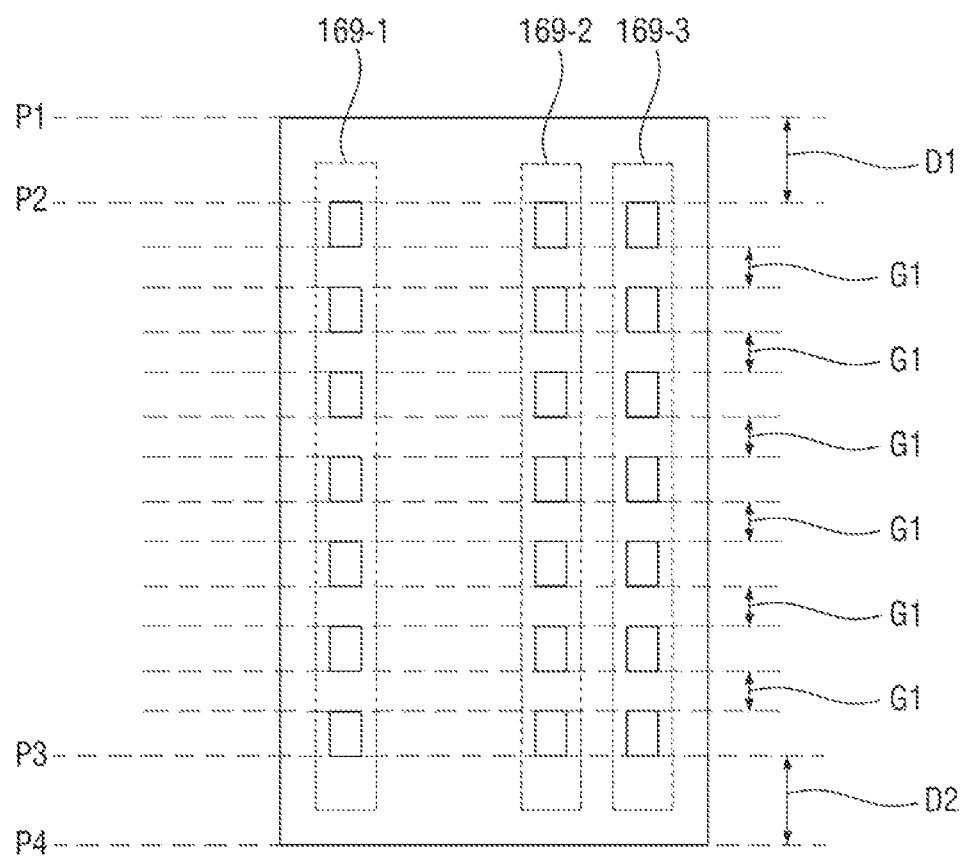
FIG. 6 is a top view of an example of the buffer chip of FIG. 5 according to embodiments.

FIG. 5 is a top view of an example of the solid state drive device of FIG. 2 according to embodiments. FIG. 6 is a top view of an example of the buffer chip of FIG. 5 according to embodiments.

Referring to FIG. 5, each of the first buffer chip 160-1 and the second buffer chip 160-2 includes a first buffer chip pad 169-1, a second buffer chip pad 169-2 and a third buffer chip pad 169-3 including a plurality of pads. The number and arrangement form of the buffer chip pads are not limited to the number and arrangement form illustrated in this drawing. In addition, in embodiments, each of the first to fifth wires 107-1 to 107-5 may be one of a plurality of wires, or may include a plurality of wires. Further, in embodiments, each of the first to fifth connection pads 105-1, 105-21, 105-31, 105-22, and 105-32 may be one of a plurality of connection pads, or may include a plurality of connection pads. In addition, in embodiments, each of first to third buffer chip pads 169-1 to 169-3 may be one of a plurality of buffer chip pads, or may include a plurality of buffer chip pads.

The first buffer chip pad 169-1 may be electrically connected to the first connection pad 105-1 through the first wire 107-1.

Each of the plurality of first nonvolatile memory chips 112 of the first nonvolatile memory chip top region 112-1 may include a first nonvolatile memory chip top pad 122-1. Also, each of the plurality of first nonvolatile memory chips 112 of the first nonvolatile memory chip bottom region 112-2 may include a first nonvolatile memory chip bottom pad 122-2.

Similarly, each of the plurality of second nonvolatile memory chips 114 of the second nonvolatile memory chip top region 114-1 may include a second nonvolatile memory chip top pad 124-1. Also, each of the plurality of second nonvolatile memory chips 114 of the second nonvolatile memory chip bottom region 114-2 may include a second nonvolatile memory chip bottom pad 124-2. Each of the pads 122-1, 122-2, 124-1, and 124-2 according to embodiments may be electrically connected to each other. The number and form of the pads 122-1, 122-2, 124-1, and 124-2 described above are not limited to the number and form illustrated in this drawing. For example, in embodiments each of the pads 122-1, 122-2, 124-1, and 124-2 may be one of a plurality of pads, or may include a plurality of pads.

The first nonvolatile memory chip top pad 122-1 may be electrically connected to the second buffer chip pad 169-2 through the second wire 107-2. The first nonvolatile memory chip bottom pad 122-2 may be electrically connected to the third buffer chip pad 169-3 through the third wire 107-3. The second nonvolatile memory chip top pad 124-1 may be electrically connected to the fifth connection pad 105-32 through the fourth wire 107-4. The second nonvolatile memory chip bottom pad 124-2 may be electrically connected to the fourth connection pad 105-22 through the fifth wire 107-5.

The first buffer chip pad 169-1 to the third buffer chip pad 169-3 may be disposed at the center of the buffer chip. Examples of this will be described in detail with reference to FIG. 6. For reference, although the second buffer chip 160-2 will be described as an example, the description of the second buffer chip 160-2 is also applicable to the first buffer chip 160-1.

Referring to FIGS. 5 and 6, the second buffer chip 160-2 may extend from a first point P1 in a fifth direction V and may be formed up to a fourth point P4. At this time, each of the first buffer chip pad 169-1 to the third buffer chip pad 169-3 may extend from the second point P2 in the second buffer chip 160-2 in the fifth direction V and may be disposed up to the third point P3. Intervals between the plurality of pads included in the first buffer chip pad 169-1 to the third buffer chip pad 169-3, for example interval G1, may be constant.

Also, if the positions of the first buffer chip pad 169-1 to the third buffer chip pad 169-3 closest from the first point P1 are set as the second point P2, a distance from the first point P1 to the second point P2 may be set as a first distance. Also, if the positions of the first buffer chip pad 169-1 to the third buffer chip pad 169-3 closest from the fourth point P4 are set as a third point P3, a distance from the fourth point P4 to the third point P3 may be set as a second distance.

The first distance D1 and the second distance D2 in the second buffer chip 160-2 according to embodiments may be the same as each other. That is, the first buffer chip pad 169-1 to the third buffer chip pad 169-3 may be located to be symmetric with respect to the fifth direction V in which the second buffer chip 160-2 extends. Accordingly, because the first buffer chip 160-1 that may be formed with the second buffer chip 160-2 turned upside down may also have the arrangement of the first buffer chip pad 169-1 to the third buffer chip pad 169-3 of the symmetric from, it is possible to remove pad stubs that may occur in the first buffer chip 160-1 and/or the second buffer chip 160-2.

Figure 7:
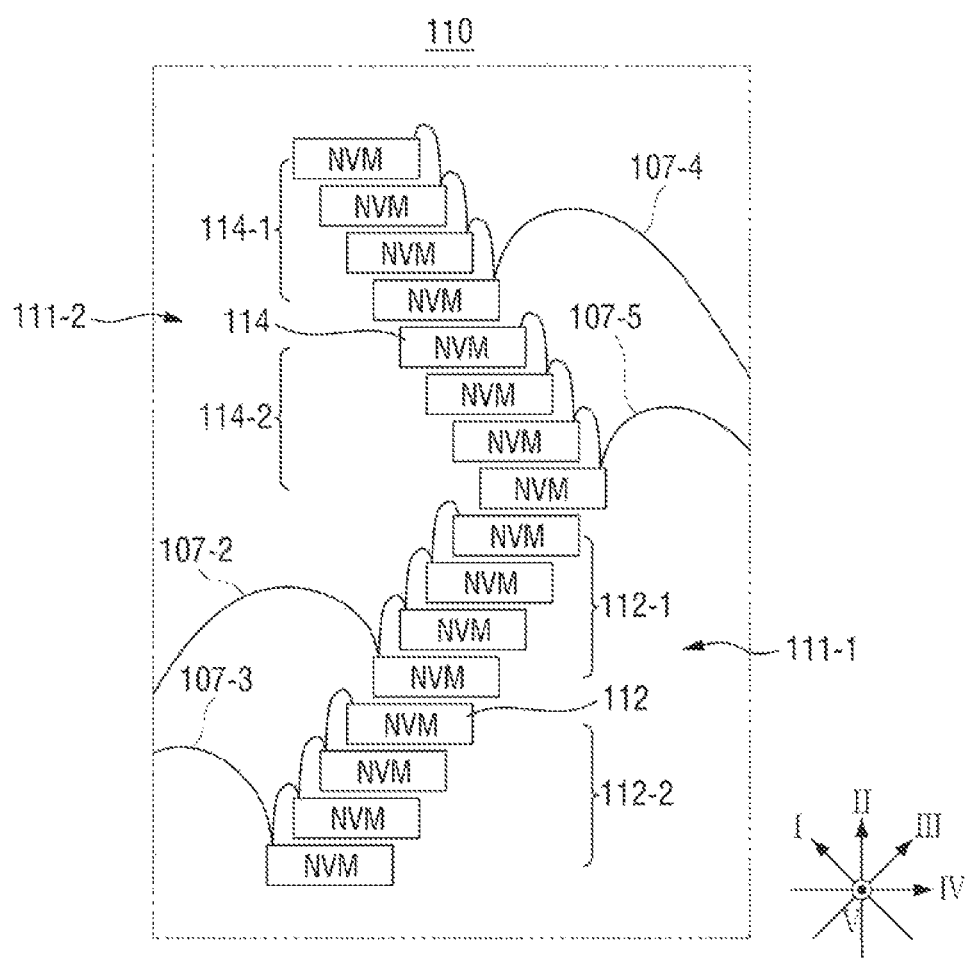
FIG. 7 is a diagram showing an example of the nonvolatile memory region of FIG. 2 according to embodiments.

FIG. 7 is a diagram showing an example of the nonvolatile memory region of FIG. 2 according to embodiments.

Figure 8:
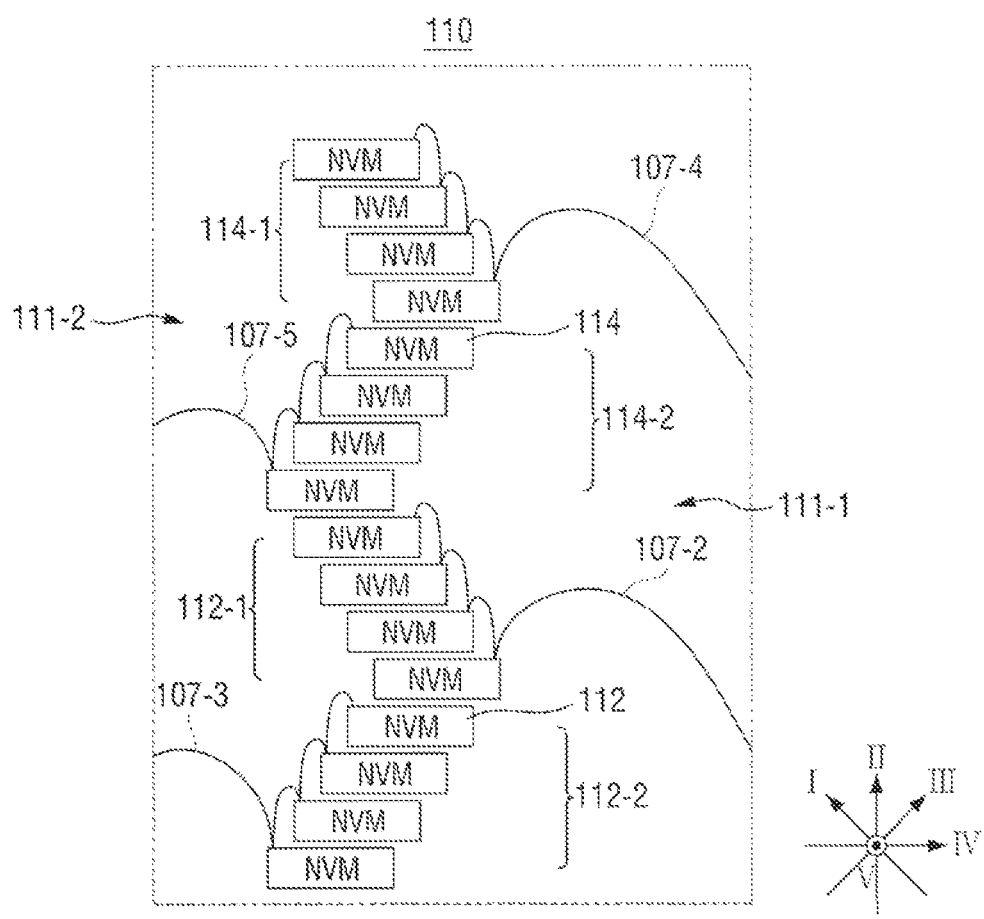
FIG. 8 is another diagram showing an example of the nonvolatile memory region of FIG. 2 according to embodiments.

FIG. 8 is another diagram showing an example of the nonvolatile memory region of FIG. 2 according to embodiments.

Referring to FIG. 7, the nonvolatile memory region 110 according to embodiments includes a first nonvolatile memory region 111-1, and a second nonvolatile memory region 111-2 disposed on the first nonvolatile memory region 111-1.

That is, unlike the example nonvolatile memory region 110 as illustrated FIG. 2 of embodiments, the second nonvolatile memory region 111-2 may be disposed on the first nonvolatile memory region 111-1. A stacking direction, for example a third direction III, of the plurality of first nonvolatile memory chips 112 of the first nonvolatile memory region 111-1 of the nonvolatile memory region 110 of FIG. 7 according to embodiments may intersect a stacking direction, for example a first direction I, of the plurality of second nonvolatile memory chips 114 of the second nonvolatile memory region 111-2. Because the plurality of nonvolatile volatile memory chips in the nonvolatile memory region 110 may collapse when the stacking direction of the plurality of first nonvolatile memory chips 112 and the stacking direction of the plurality of second nonvolatile memory chips 114 are the same, in embodiments the plurality of nonvolatile volatile memory chips may be stacked in the directions different from each other.

Because an electrical connection type of each nonvolatile memory chip may be the same as that of FIG. 2, the explanation thereof will not be provided.

Referring to FIG. 8, unlike FIG. 7, each of the examples of first nonvolatile memory region 111-1 and the second nonvolatile memory region 111-2 of the nonvolatile memory region 110 as illustrated in FIG. 8 according to embodiments may have the form of the plurality of stacked nonvolatile memory chips having two different directions.

The plurality of first nonvolatile memory chips 112 of the first nonvolatile memory chip bottom region 112-2 may be stacked in a third direction III. The plurality of first nonvolatile memory chips 112 of the first nonvolatile memory chip top region 112-1 may be stacked in the first direction I. The plurality of second nonvolatile memory chips 114 of the second nonvolatile memory chip bottom region 114-2 may be stacked in the third direction III. The plurality of second nonvolatile memory chips 114 of the second nonvolatile memory chip top region 114-1 may be stacked in the first direction I.

That is, in embodiments the arrangement of the plurality of nonvolatile memory chips of the nonvolatile memory region 110 of FIG. 8 may be slightly more stable than the arrangement of FIG. 7.

Figure 9:
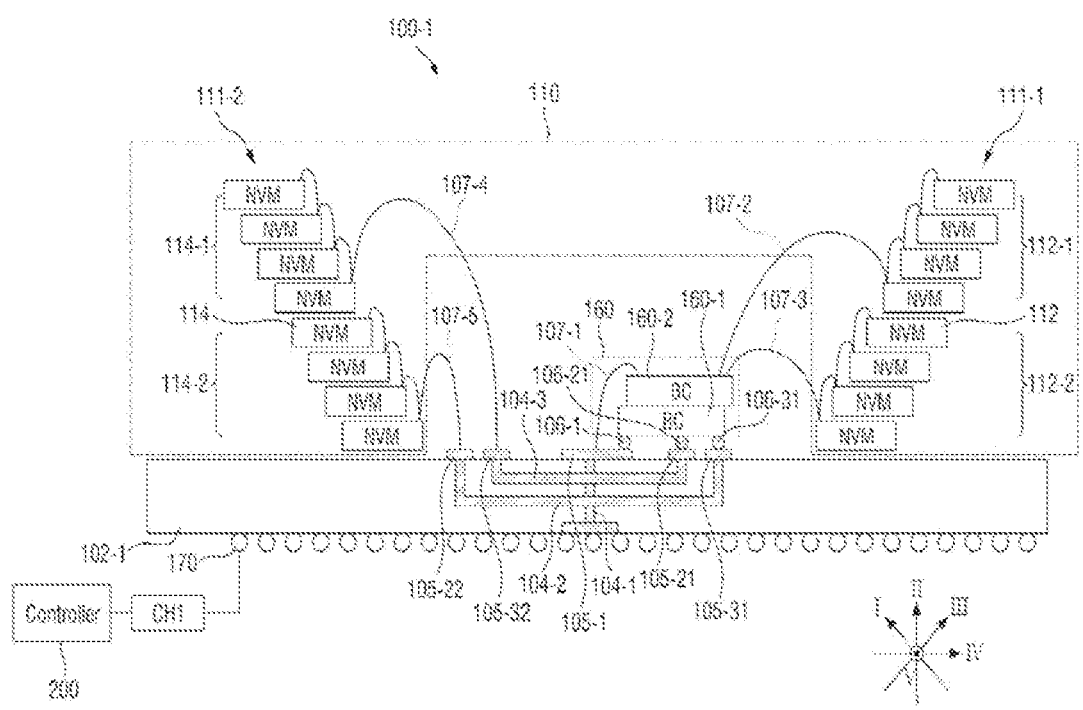
FIG. 9 is a diagram showing an example of a solid state drive device according to embodiments.

FIG. 9 is a diagram showing an example of a solid state drive device according to embodiments.

For reference, unlike FIG. 2, because the operation and the connection type of FIG. 9 are the same as those of in FIG. 2 except that the buffer region 160 is disposed between the first nonvolatile memory region 111-1 and the second nonvolatile memory region 111-2, the explanation thereof will not be provided.

Figure 10:
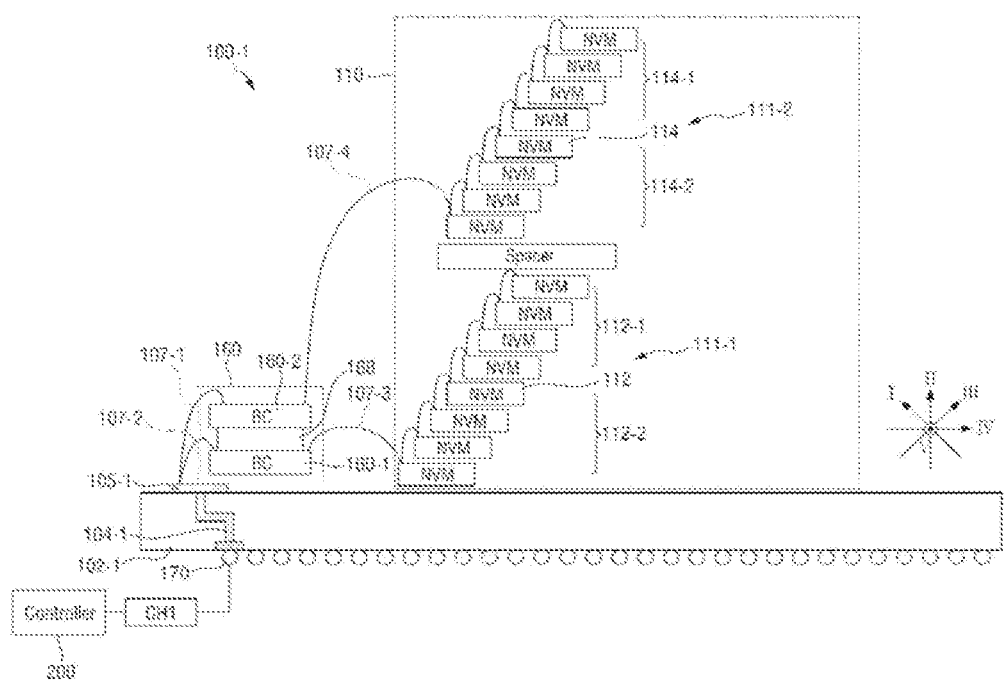
FIG. 10 is a diagram showing an example of a solid state drive device according to embodiments.

FIG. 10 is a diagram showing an example of a solid state drive device according to embodiments.

Referring to FIG. 10, a supporting film 168 may be disposed between the first buffer chip 160-1 and the second buffer chip 160-2 of the buffer region 160. The supporting film 168 may be, for example, but is not limited to, a Die Attach Film (DAF).

Unlike FIG. 2, the example of first buffer chip 160-1 as illustrated in FIG. 10 according to embodiments may be connected to the first connection pad 105-1 through wire bonding to be electrically connected to the first redistribution layer 104-1.

In detail, the first buffer chip 160-1 may be connected to the first connection pad 105-1 through the second wire 107-2, and may be electrically connected to the first nonvolatile memory region 111-1 through the third wire 107-3 to transmit and receive data between the controller 200 and the first nonvolatile memory region 111-1.

The second nonvolatile memory region 111-2 of the nonvolatile memory region 110 of FIG. 10 according to embodiments may be disposed on the first nonvolatile memory region 111-1, and a spacer may be disposed between the first nonvolatile memory region 111-1 and the second nonvolatile memory region 111-2. The spacer according to embodiments may be a silicon material.

When the first nonvolatile memory region 111-1 and the second nonvolatile memory region 111-2 on the first nonvolatile memory region 111-1 are continuously stacked in the third direction III, the plurality of nonvolatile memory chips, for example the first nonvolatile memory chip 112 and/or the second nonvolatile memory chip 114, may collapse. Therefore, the spacer may be disposed on the first nonvolatile memory region 111-1, and the second nonvolatile memory region 111-2 may be formed from a position moved in the—fourth direction IV further than the position of the first nonvolatile memory chip 112 located at the uppermost layer part in the second direction II of the first nonvolatile memory region 111-1, which makes it possible to increase the stability of a plurality of nonvolatile memory chips in the nonvolatile memory region 110.

The spacer may be attached to the first nonvolatile memory chip 112 and/or the second nonvolatile memory chip 114 through an insulating adhesive. Also, the spacer may be formed to be larger than a width in the fourth direction IV and/or a width in the fifth direction V of the first nonvolatile memory chip 112 and/or the second nonvolatile memory chip 114 so that the second nonvolatile memory region 111-2 may be stably formed.

The second nonvolatile memory region 111-2 may be connected to the second buffer chip 160-2 through the fourth wire 107-4. The second buffer chip 160-2 may be connected to the first connection pad 105-1 through the first wire 107-1. Therefore, data may be transmitted and received between the controller 200 and the second nonvolatile memory region 111-2 through the second buffer chip 160-2.

In order to increase the storage capacity of the solid state drive device, the number of the plurality of nonvolatile memory chips, for example a plurality of first nonvolatile memory chips 112 or a plurality of second nonvolatile memory chips 114, connected to the same channel, for example the first channel CH1, may be increased. However, as the number of nonvolatile memory chips connected to the same channel increases, the parasitic capacitance of the plurality of nonvolatile memory chips formed in the same channel may increase. Therefore, there is a high probability of an occurrence of a phenomenon in which signals transmitted from the controller 200 to the plurality of nonvolatile memory chips are reflected and returned.

However, in the solid state drive device according to embodiments, the regions of the plurality of nonvolatile memory chips connected to the same channel may be divided, for example, the first nonvolatile memory region 111-1 and the second nonvolatile memory regions 111-2, and may be formed to be connected to the same channel to be spaced apart from each other. Therefore, it is possible to prevent a phenomenon in which the signal transmitted from the controller 200 is reflected.

In addition, as for the plurality of stacked buffer chips, for example, the first buffer chip 160-1 and the second buffer chip 160-2, some buffer chip, for example, the first buffer chip 160-1, may transmit and receive signals to and from the controller 200 in the form of flip chip, and the remaining buffer chip, for example the second buffer chip 160-2, may transmit and receive signals to and from the controller 200 in the form of wire bonding, which makes it possible to reduce parasitic capacitance components that may hinder signal integrity.

Figure 11:
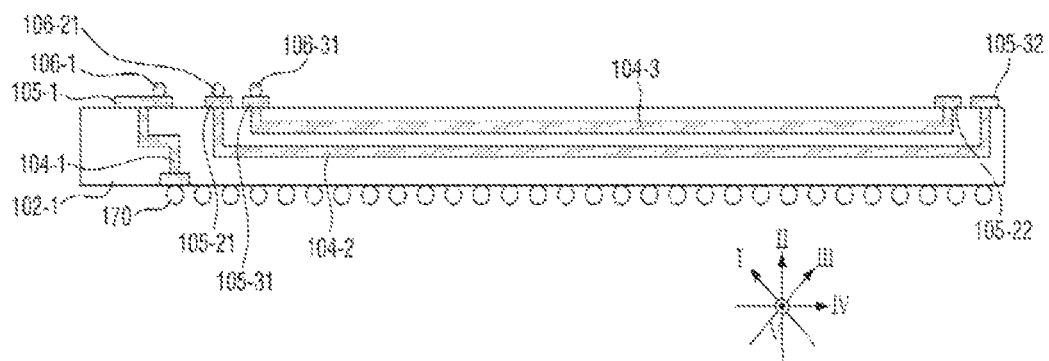
FIGS. 11 to 13 are intermediate stage diagrams showing examples of a method for fabricating the solid state drive device of FIG. 2 according to embodiments.
Figure 12:
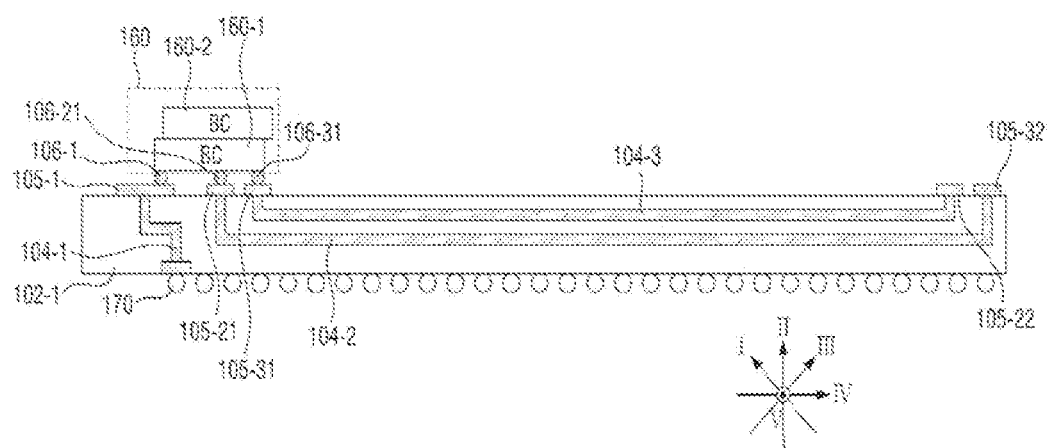
Figure 13:
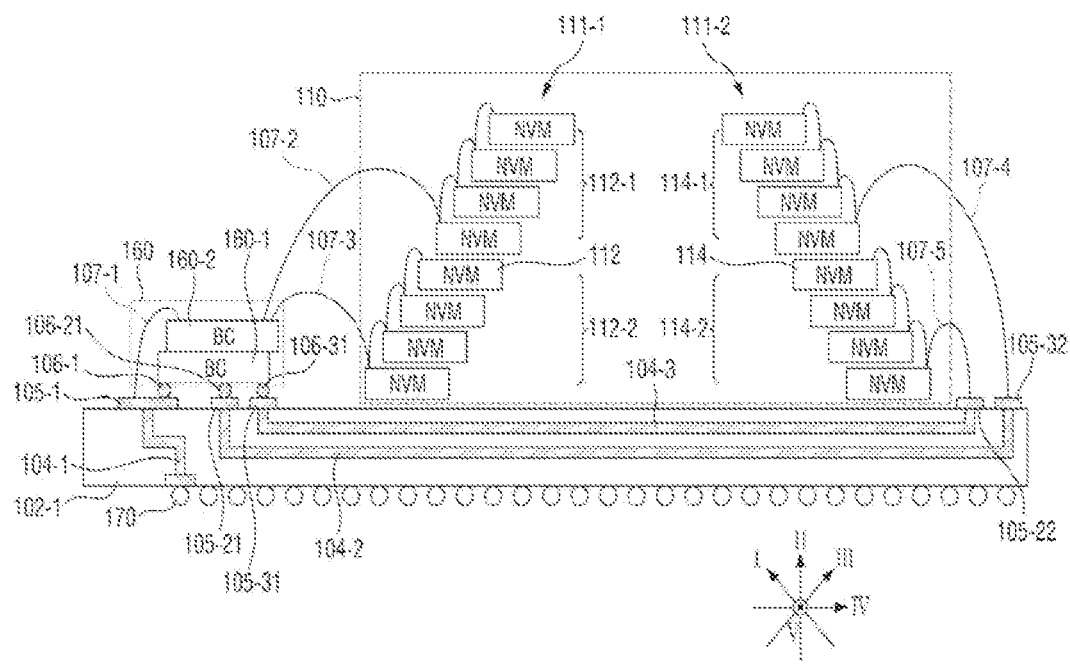

FIGS. 11 to 13 are intermediate stage diagrams showing examples of a method for fabricating the solid state drive device of FIG. 2 according to embodiments.

Referring to FIG. 11, a first redistribution layer 104-1 to a third redistribution layer 104-3 may be formed in the substrate 102-1, and a plurality of external connection terminals 170 may be formed in a lower part of the substrate 102-1. A first connection pad 105-1 connected to the first redistribution layer 104-1, a second connection pad 105-21 and a fifth connection pad 105-32 connected to the second redistribution layer 104-2, and a third connection pad 105-31 and a fourth connection pad 105-22 connected to the third redistribution layer 104-3 may be formed on an upper part facing the lower part of the substrate 102-1. A first connection terminal 106-1 may be formed on the first connection pad 105-1, a second connection terminal 106-21 may be formed on the second connection pad 105-21, and a third connection terminal 106-31 may be formed on the third connection pad 105-31.

Next, referring to FIG. 12, the first buffer chip 160-1 and the second buffer chip 160-2 may be sequentially stacked on the first connection terminal 106-1 to the third connection terminal 106-31 to form a buffer region 160.

Further, referring to FIG. 13, the nonvolatile memory region 110 may be formed on the substrate. Although only the method for fabricating the solid state drive of FIG. 2 according to embodiments has been described, it is also equally applicable to the remaining other examples. For convenience of explanation, description of some other embodiments will be omitted.

Figure 14:
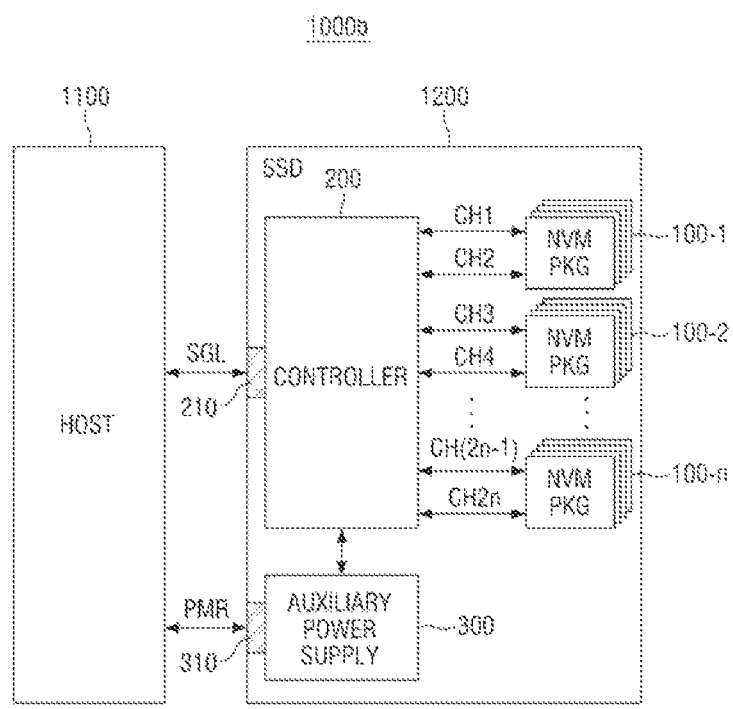
FIG. 14 is a block diagram showing a solid state drive system according to embodiments.

FIG. 14 is an exemplary block diagram showing a solid state drive system according to embodiments.

Referring to FIG. 14, a solid state drive system 1000b includes a host 1100 and a solid state drive device 1200. The solid state drive device 1200 may include a plurality of nonvolatile memory packages 100-1 to 100-n. The plurality of nonvolatile memory packages 100-1 to 100-n may be used as a storage medium of the solid state drive device 1200.

Each of the plurality of nonvolatile memory packages 100-1 to 100-n according to embodiments may include a plurality of nonvolatile memory chips. The plurality of nonvolatile memory chips may include, but are not limited to, a flash memory device.

The controller 200 may be connected to a plurality of nonvolatile memory packages 100-1 to 100-n through a plurality of channels CH1 to CH2n. The solid state drive device 1200 may be same as the example illustrated in FIG. 1 except that each of the plurality of nonvolatile memory packages 100-1 to 100-n included in the solid state drive device 1200 of FIG. 1 according to embodiments may be connected to the controller 200 through one channel, and meanwhile, each of the plurality of nonvolatile memory packages 100-1 to 100-n included in the solid state drive device 1200 of FIG. 14 according to embodiments may be connected to the controller 200 through two channels. Therefore, repeated parts of explanation mentioned above will be omitted. Hereinafter, the internal configuration of the nonvolatile memory region will be omitted to utilize the space of the drawing.

FIGS. 15 to 22 are block diagrams showing examples of a solid state drive device according to embodiments.

Figure 15:
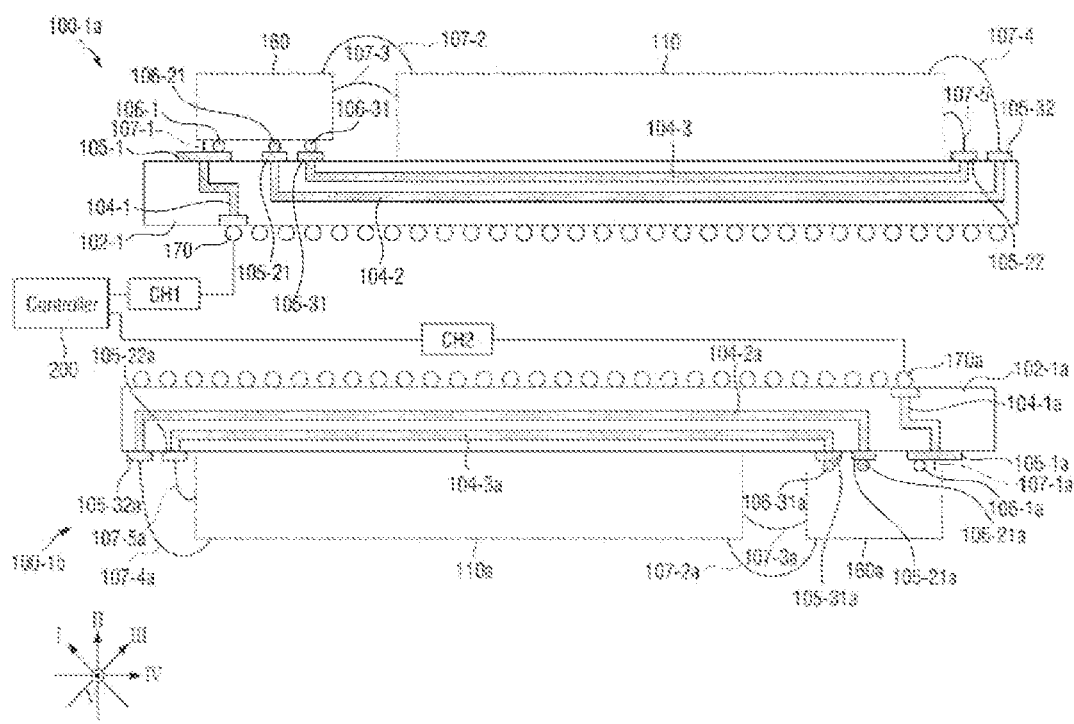
FIGS. 15 to 22 are block diagrams showing examples of a solid state drive device according to embodiments.
Figure 16:
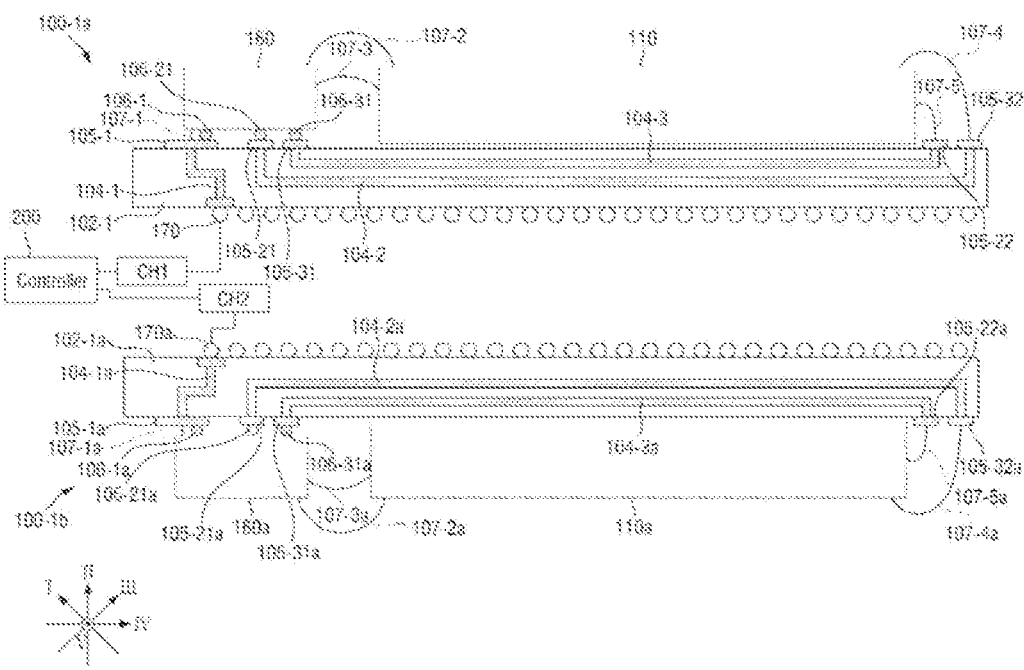

Referring to FIGS. 15 and 16, the solid state drive device according to embodiments may include an upper first nonvolatile memory package 100-1a connected to the first channel CH1, and a lower first nonvolatile memory package 100-1b connected to the second channel CH2.

That is, the upper first nonvolatile memory package 100-1a may transmit and receive data to and from the controller 200 through the first channel CH1, and the lower first nonvolatile memory package 100-1b may transmit and receive data to and from the controller 200 through the second channel CH2.

In embodiments, the lower first non-volatile memory package 100-1b of FIGS. 15 to 18 may include lower substrate 102-1a, lower external connection terminals 170a, lower first to third redistribution layers 104-1a to 104-3a, lower first to fifth connection pads 105-1a, 105-21a, 105-31a, 105-22a, and 105-32a, lower first to fifth wires 107-1 to 107-5, and lower first to third connection terminals 106-1a, 106-21a, and 106-31a.

The buffer region 160 and/or the lower buffer region 160a may have the same configuration as that of the buffer region 160 of FIG. 2. The nonvolatile memory region 110 and/or the lower nonvolatile memory region 110a may be the same as the nonvolatile memory region 110 of FIG. 2, the nonvolatile memory region 110 of FIG. 7 or the nonvolatile memory region 110 of FIG. 8.

Figure 17:
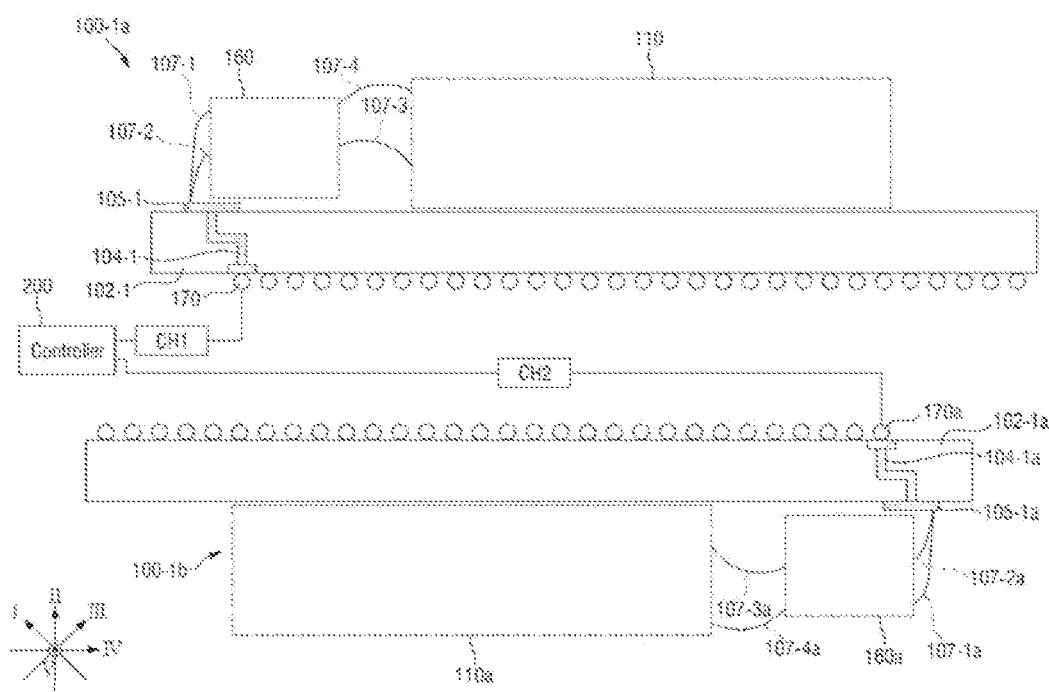
Figure 18:
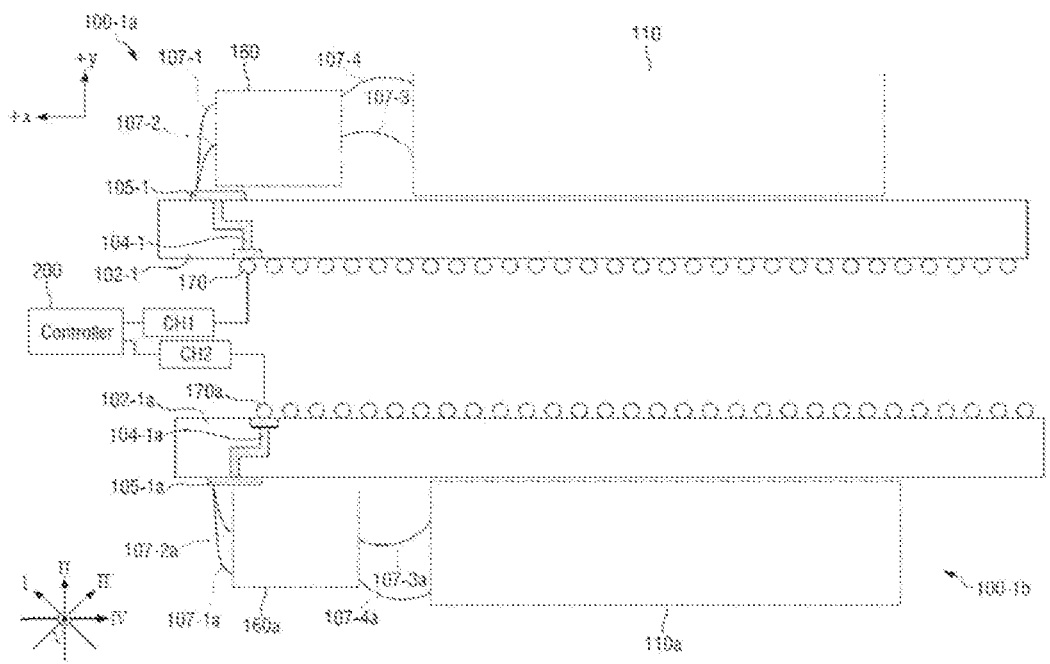

Referring to FIGS. 17 and 18, the solid state drive device includes an upper first nonvolatile memory package 100-1a connected to the first channel CH1, and a lower first nonvolatile memory package 100-1b connected to the second channel CH2.

That is, the upper first nonvolatile memory package 100-1a may transmit and receive data to and from the controller 200 through the first channel CH1, and the lower first nonvolatile memory package 100-1b may transmit and receive data to and from the controller 200 through the second channel CH2.

The buffer region 160 and/or the lower buffer region 160a may have the same configuration as that of the buffer region 160 of FIG. 10. The nonvolatile memory region 110 and/or the lower nonvolatile memory region 110a may be the same as the nonvolatile memory region 110 of FIG. 10.

Figure 19:
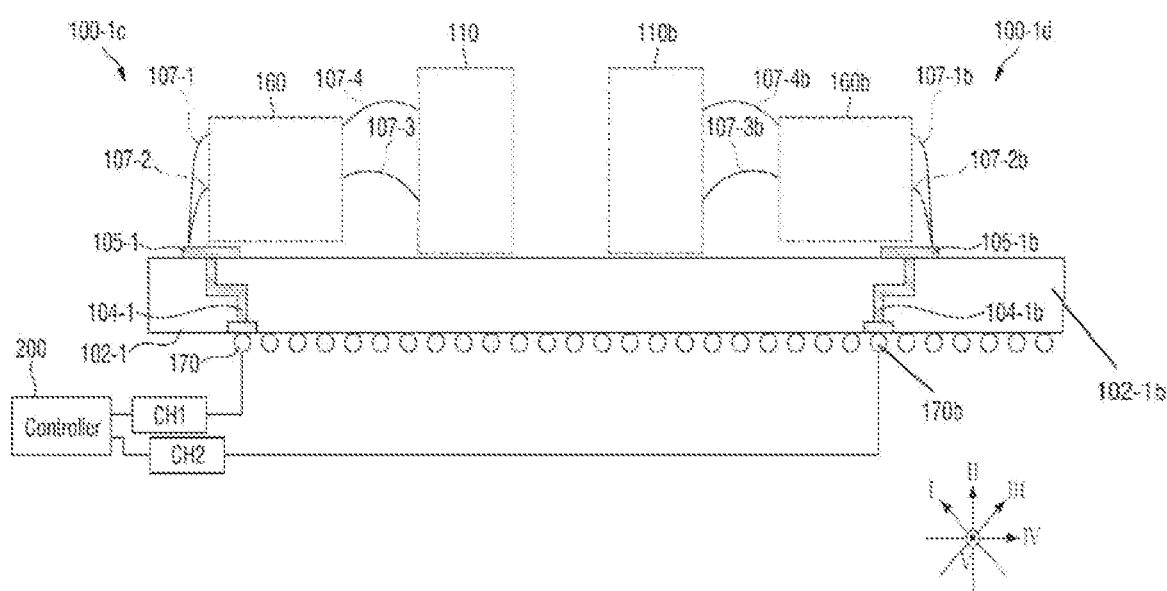
Figure 20:
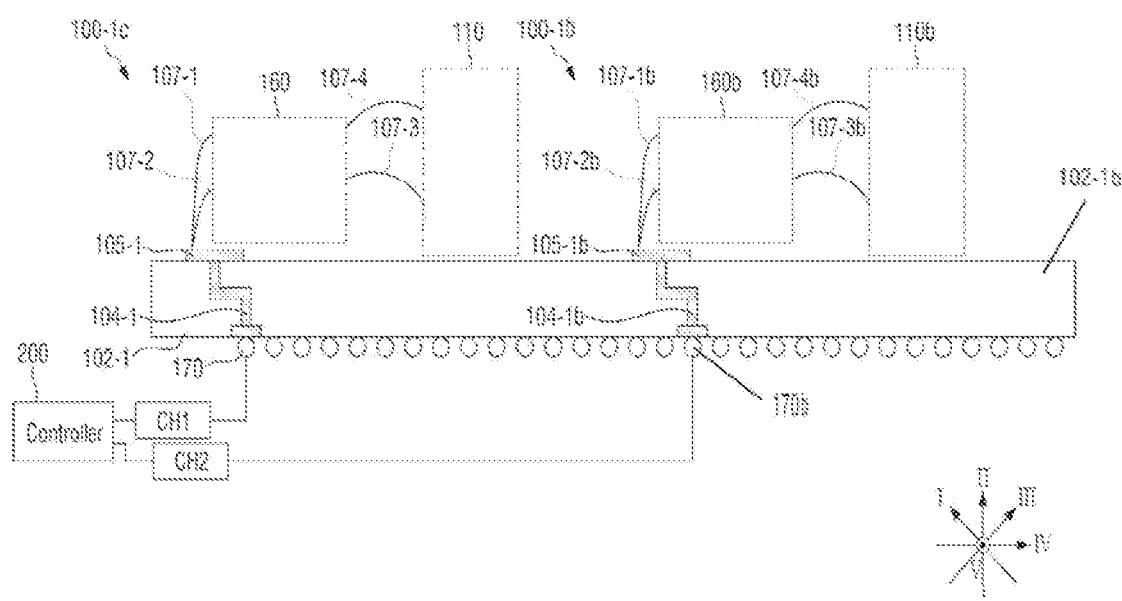

Referring to FIGS. 19 and 20, the solid state drive device may include a left first nonvolatile memory package 100-1c connected to the first channel CH1, and a right first nonvolatile memory package 100-1d connected to the second channel CH2.

That is, the left first nonvolatile memory package 100-1c may transmit and receive data to and from the controller 200 through the first channel CH1, and the right first nonvolatile memory package 100-1d may transmit and receive data to and from the controller 200 through the second channel CH2.

In embodiments, the right first non-volatile memory package 100-1d of FIGS. 19 to 22 may include right substrate 102-1b, right external connection terminals 170b, right first to third redistribution layers 104-1b to 104-3b, right first to fifth connection pads 105-1b, 105-21b, 105-31b, 105-22b, and 105-32b, right first to fifth wires 107-1 to 107-5, and right first to third connection terminals 106-1b, 106-21b, and 106-31a.

The left buffer region 160 and/or the right buffer region 160b may have the same configuration as that of the buffer region 160 of FIG. 10. The left nonvolatile memory region 110 and/or the right nonvolatile memory region 110b may be the same as the nonvolatile memory region 110 of FIG. 10.

Figure 21:
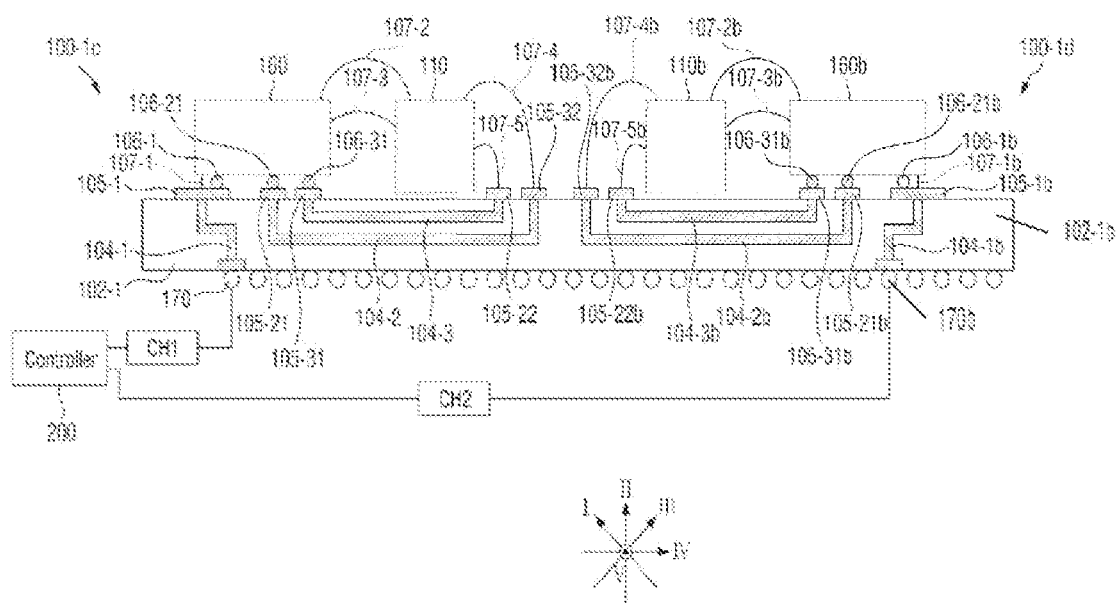
Figure 21:
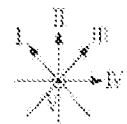
Figure 22:
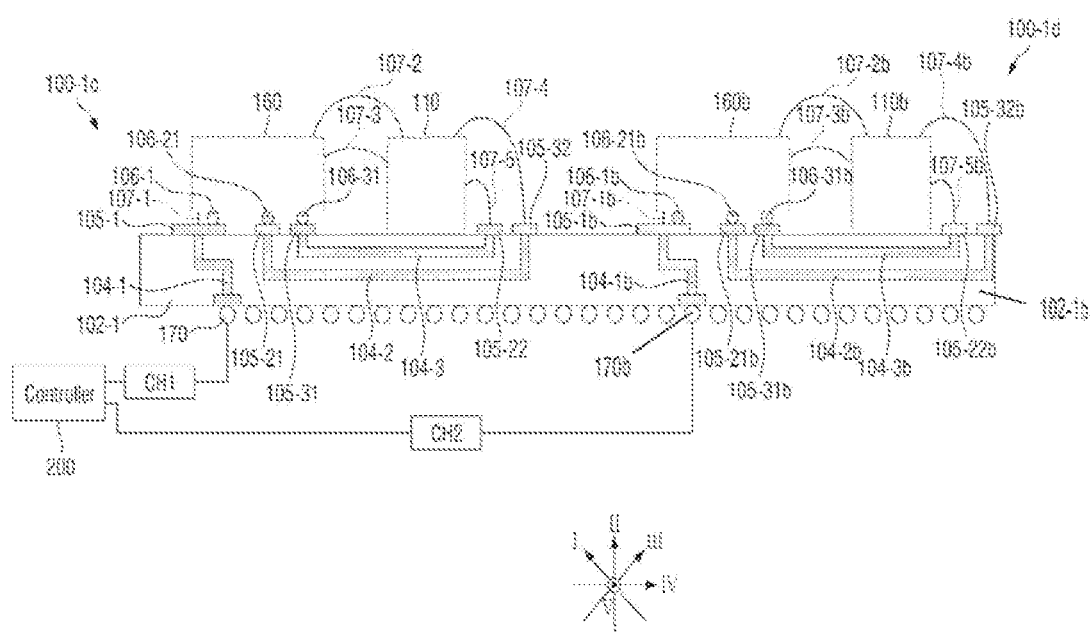

Referring to FIGS. 21 and 22, the solid state drive device according to embodiments may include a left first nonvolatile memory package 100-1c connected to the first channel CH1, and a right first nonvolatile memory package 100-1d connected to the second channel CH2.

That is, the left first nonvolatile memory package 100-1c may transmit and receive data to and from the controller 200 through the first channel CH1, and the right first nonvolatile memory package 100-1d may transmit and receive data to and from the controller 200 through the second channel CH2.

The left buffer region 160 and/or the right buffer region 160b may have the same configuration as that of the buffer region 160 of FIG. 2. The left nonvolatile memory region 110 and/or the right nonvolatile memory region 110b may be the same as the nonvolatile memory region 110 of FIG. 2, the nonvolatile memory region 110 of FIG. 7 or the nonvolatile memory region 110 of FIG. 8.

In concluding the detailed description, those skilled in the art will appreciate that many variations and modifications may be made to the preferred embodiments without substantially departing from the principles of the present disclosure. Therefore, the disclosed embodiments of the invention are used in a generic and descriptive sense only and not for purposes of limitation.

What is claimed is:

1. A solid state drive (SSD) comprising:
    a substrate;
    a first buffer chip disposed on the substrate;
    a second buffer chip disposed on the first buffer chip;
    a plurality of first nonvolatile memory chips;
    a plurality of second nonvolatile memory chips; and
    a controller configured to transmit a control signal to the plurality of first nonvolatile memory chips and the plurality of second nonvolatile memory chips through a first channel,
    wherein the plurality of first nonvolatile memory chips are disposed between the first buffer chip and the plurality of second nonvolatile memory chips,
    wherein the plurality of first nonvolatile memory chips are connected to the second buffer chip and are not connected to the first buffer chip, and
    wherein the plurality of second nonvolatile memory chips are connected to the first buffer chip and are not connected to the second buffer chip.

2. The SSD of claim 1, wherein the plurality of first nonvolatile memory chips and the plurality of second nonvolatile memory chips are electrically connected to the controller through only one channel that is the first channel.

3. The SSD of claim 1, wherein the plurality of first nonvolatile memory chips are connected to the second buffer chip through a first wire.

4. The SSD of claim 1, further comprising a first redistribution layer disposed in the substrate and configured to electrically connect the first channel to the first buffer chip.

5. The SSD of claim 4, wherein the first buffer chip is connected to the first redistribution layer through a first flip chip, and the second buffer chip is connected to the first redistribution layer through a second wire.

6. The SSD of claim 1, further comprising
a plurality of third nonvolatile memory chips;
a plurality of fourth nonvolatile memory chips;
a third buffer chip; and
a fourth buffer chip disposed on the third buffer chip,
wherein the plurality of third nonvolatile memory chips and the plurality of fourth nonvolatile memory chips are electrically connected to the controller through only one channel that is a second channel.

7. The SSD of claim 1, wherein the plurality of first nonvolatile memory chips include a first chip and a second chip,
an upper surface of the first chip includes a first portion and a second portion, and
the second chip is disposed on the first portion of the upper surface of the first chip and is not disposed on the second portion of the upper surface of the first chip.

8. A solid state drive (SSD) comprising:
a substrate;
a first buffer chip disposed on the substrate;
a second buffer chip disposed on the first buffer chip;
a plurality of first nonvolatile memory chips;
a plurality of second nonvolatile memory chips; and
a controller configured to transmit a control signal to the plurality of first nonvolatile memory chips and the plurality of second nonvolatile memory chips through a first channel,
wherein the first buffer chip and the second buffer chip are disposed between the plurality of first nonvolatile memory chips and the plurality of second nonvolatile memory chips,
wherein the plurality of first nonvolatile memory chips are connected to the second buffer chip and are not connected to the first buffer chip, and
wherein the plurality of second nonvolatile memory chips are connected to the first buffer chip and are not connected to the second buffer chip.

9. The SSD of claim 8, wherein the plurality of first nonvolatile memory chips and the plurality of second nonvolatile memory chips are electrically connected to the controller through only one channel that is the first channel.

10. The SSD of claim 8, wherein the plurality of first nonvolatile memory chips are connected to the second buffer chip through a first wire.

11. The SSD of claim 8, further comprising a first redistribution layer disposed in the substrate and configured to electrically connect the first channel to the first buffer chip.

12. The SSD of claim 11, wherein the first buffer chip is connected to the first redistribution layer through a first flip chip, and the second buffer chip is connected to the first redistribution layer through a second wire.

13. The SSD of claim 8, further comprising
a plurality of third nonvolatile memory chips;
a plurality of fourth nonvolatile memory chips;
a third buffer chip; and
a fourth buffer chip disposed on the third buffer chip,
wherein the plurality of third nonvolatile memory chips and the plurality of fourth nonvolatile memory chips are electrically connected to the controller through only one channel that is a second channel.

14. A solid state drive (SSD) comprising:
a substrate;
a first buffer chip disposed on the substrate;
a second buffer chip disposed on the first buffer chip;
a plurality of first nonvolatile memory chips;
a plurality of second nonvolatile memory chips; and
a controller configured to transmit a control signal to the plurality of first nonvolatile memory chips and the plurality of second nonvolatile memory chips through a first channel,
wherein the plurality of second nonvolatile memory chips are disposed on the plurality of first nonvolatile memory chips,
wherein the plurality of first nonvolatile memory chips are connected to the second buffer chip and are not connected to the first buffer chip, and
wherein the plurality of second nonvolatile memory chips are connected to the first buffer chip and are not connected to the second buffer chip.

15. The SSD of claim 14, further comprising a spacer disposed between the plurality of first nonvolatile memory chips and the plurality of second nonvolatile memory chips.

16. The SSD of claim 14, wherein the plurality of first nonvolatile memory chips and the plurality of second nonvolatile memory chips are electrically connected to the controller through only one channel that is the first channel.

17. The SSD of claim 14, wherein the plurality of first nonvolatile memory chips are connected to the second buffer chip through a first wire.

18. The SSD of claim 14, further comprising a first redistribution layer disposed in the substrate and configured to electrically connect the first channel to the first buffer chip.

19. The SSD of claim 18, wherein the first buffer chip is connected to the first redistribution layer through a first flip chip, and the second buffer chip is connected to the first redistribution layer through a second wire.

20. The SSD of claim 14, further comprising
a plurality of third nonvolatile memory chips;
a plurality of fourth nonvolatile memory chips;
a third buffer chip; and
a fourth buffer chip disposed on the third buffer chip,
wherein the plurality of third nonvolatile memory chips and the plurality of fourth nonvolatile memory chips are electrically connected to the controller through only one channel that is a second channel.

* * * * *